United States Patent
Yamashita

(10) Patent No.: US 8,773,840 B2
(45) Date of Patent: Jul. 8, 2014

(54) MONOLITHIC CERAMIC ELECTRONIC COMPONENT

(75) Inventor: Yasuharu Yamashita, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 228 days.

(21) Appl. No.: 13/491,625

(22) Filed: Jun. 8, 2012

(65) Prior Publication Data
US 2012/0250221 A1 Oct. 4, 2012

Related U.S. Application Data

(63) Continuation of application No. PCT/JP2010/072216, filed on Dec. 10, 2010.

(30) Foreign Application Priority Data

Dec. 11, 2009 (JP) ................................. 2009-281682

(51) Int. Cl.
| | |
|---|---|
| *H01G 4/30* | (2006.01) |
| *H01G 4/005* | (2006.01) |
| *H01G 4/228* | (2006.01) |
| *H01G 4/232* | (2006.01) |

(52) U.S. Cl.
CPC .................. *H01G 4/30* (2013.01); *H01G 4/005* (2013.01); *H01G 4/228* (2013.01); *H01G 4/232* (2013.01)
USPC .................. 361/321.2; 361/321.1; 361/308.1; 361/305; 361/306.1; 361/306.3

(58) Field of Classification Search
CPC ......... H01G 4/30; H01G 4/005; H01G 4/228; H01G 4/12; H01G 4/232
USPC ................ 361/321.2, 303–305, 308.1, 308.2, 361/309–312, 306.1, 306.3, 321.1
See application file for complete search history.

(56) References Cited

U.S. PATENT DOCUMENTS

| | | | |
|---|---|---|---|
| 6,377,439 B1 | 4/2002 | Sekidou et al. | |
| 6,839,243 B2 * | 1/2005 | Kotani et al. | 361/790 |

(Continued)

FOREIGN PATENT DOCUMENTS

| | | |
|---|---|---|
| EP | 1 553 605 A2 | 7/2005 |
| EP | 1 630 831 A2 | 3/2006 |

(Continued)

OTHER PUBLICATIONS

Official Communication issued in International Patent Application No. PCT/JP2010/072216, mailed on Mar. 15, 2011.

(Continued)

*Primary Examiner* — Nguyen T Ha
(74) *Attorney, Agent, or Firm* — Keating & Bennett, LLP

(57) ABSTRACT

An electronic component includes a ceramic sintered body, and a plurality of first and second inner electrodes alternately arranged inside the ceramic sintered body to be opposed to each other in a third direction with a ceramic layer interposed between the adjacent first and second inner electrodes. The first and second inner electrodes are each arranged to be exposed to a third or fourth surface without being exposed to fifth and sixth surfaces. Heterogeneous regions, which include solid solutions of metals included in the first and second inner electrodes and the ceramic sintered body, are arranged continuously in opposite end portions of the ceramic sintered body in a first direction to extend from one side end to an opposite side end of a region where the first and second inner electrodes are disposed in a third direction.

9 Claims, 11 Drawing Sheets

(56) References Cited

U.S. PATENT DOCUMENTS

| | | | |
|---|---|---|---|
| 7,345,868 B2 * | 3/2008 | Trinh ........................ | 361/306.3 |
| 8,482,899 B2 * | 7/2013 | Yamamoto et al. ......... | 361/321.2 |
| 8,498,096 B2 * | 7/2013 | Kobayashi ................ | 361/306.3 |
| 8,559,160 B2 * | 10/2013 | Kim et al. .................... | 361/303 |
| 8,593,785 B2 * | 11/2013 | Sasabayashi et al. ...... | 361/321.2 |
| 8,654,504 B2 * | 2/2014 | Sakuratani et al. ........ | 361/306.3 |
| 2003/0016484 A1 | 1/2003 | Iwaida et al. | |
| 2006/0240973 A1 | 10/2006 | Koga et al. | |
| 2008/0304204 A1 | 12/2008 | Suzuki | |
| 2010/0085682 A1 | 4/2010 | Abe et al. | |

FOREIGN PATENT DOCUMENTS

| | | | |
|---|---|---|---|
| JP | 59-222917 A | 12/1984 | |
| JP | 60-124813 A | 7/1985 | |
| JP | 61-15315 A | 1/1986 | |
| JP | 61-237413 A | 10/1986 | |
| JP | 61-248413 A | 11/1986 | |
| JP | 3-241802 A | 10/1991 | |
| JP | 3-241813 A | 10/1991 | |
| JP | 6-013259 A | 1/1994 | |
| JP | 6-349669 A | 12/1994 | |
| JP | 7-122455 A | 5/1995 | |
| JP | 9-153433 A | 6/1997 | |
| JP | 10-308322 A | 11/1998 | |
| JP | 2001-035738 A | 2/2001 | |
| JP | 2002-037663 A | 2/2002 | |
| JP | 2002-260949 A | 9/2002 | |
| JP | 2003-017356 A | 1/2003 | |
| JP | 2003-318060 A | 11/2003 | |
| JP | 2005-223313 A | 8/2005 | |
| JP | 2006-073623 A | 3/2006 | |
| JP | 2009-016796 A | 1/2009 | |
| JP | 2010-092896 A | 4/2010 | |
| JP | 2010-093037 A | 4/2010 | |
| JP | 2010-093038 A | 4/2010 | |
| JP | 2012-094819 A | 5/2012 | |
| JP | 2012-094820 A | 5/2012 | |
| KR | 10-2008-0108012 A | 12/2008 | |
| WO | 02/08147 A1 | 1/2002 | |
| WO | 2005/016845 A1 | 2/2005 | |

OTHER PUBLICATIONS

Yamashita et al.; "Multilayer Ceramic Electronic Component"; U.S. Appl. No. 13/491,624; filed Jun. 8, 2012.

Fukunaga et al.; "Monolithic Ceramic Capacitor"; U.S. Appl. No. 13/491,626; filed Jun. 8, 2012.

Shiota; "Monolithic Ceramic Capacitor"; U.S. Appl. No. 13/491,627; filed Jun. 8, 2012.

* cited by examiner

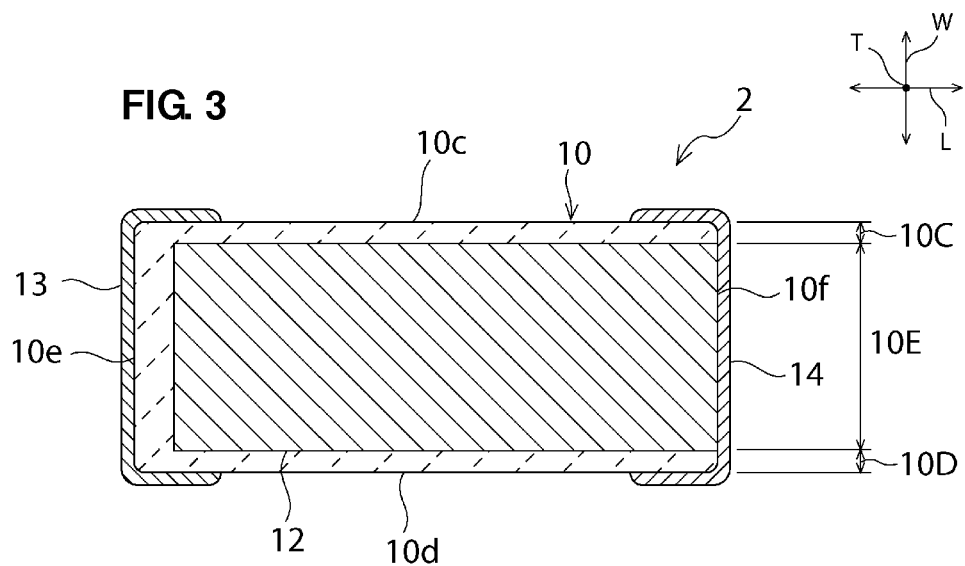
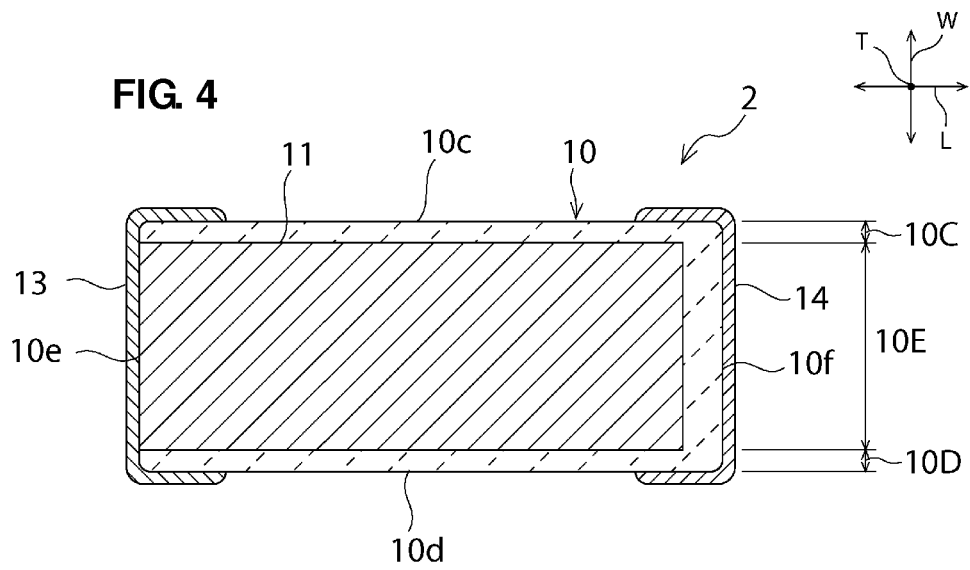

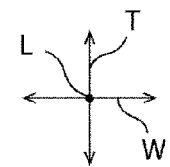
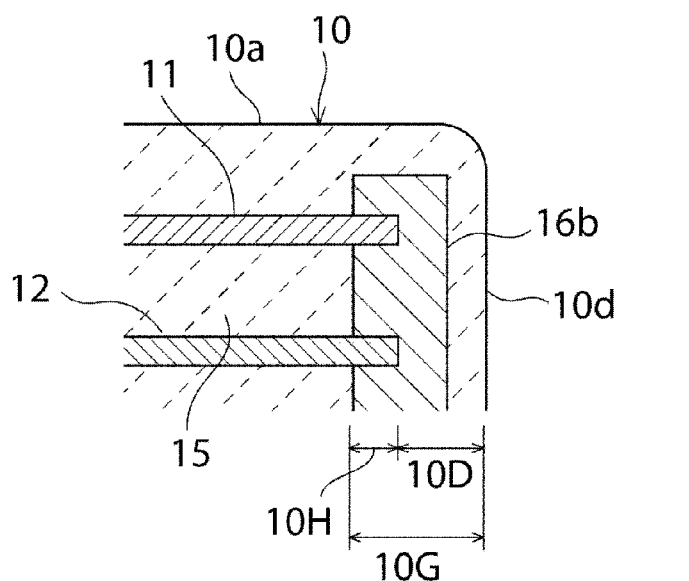
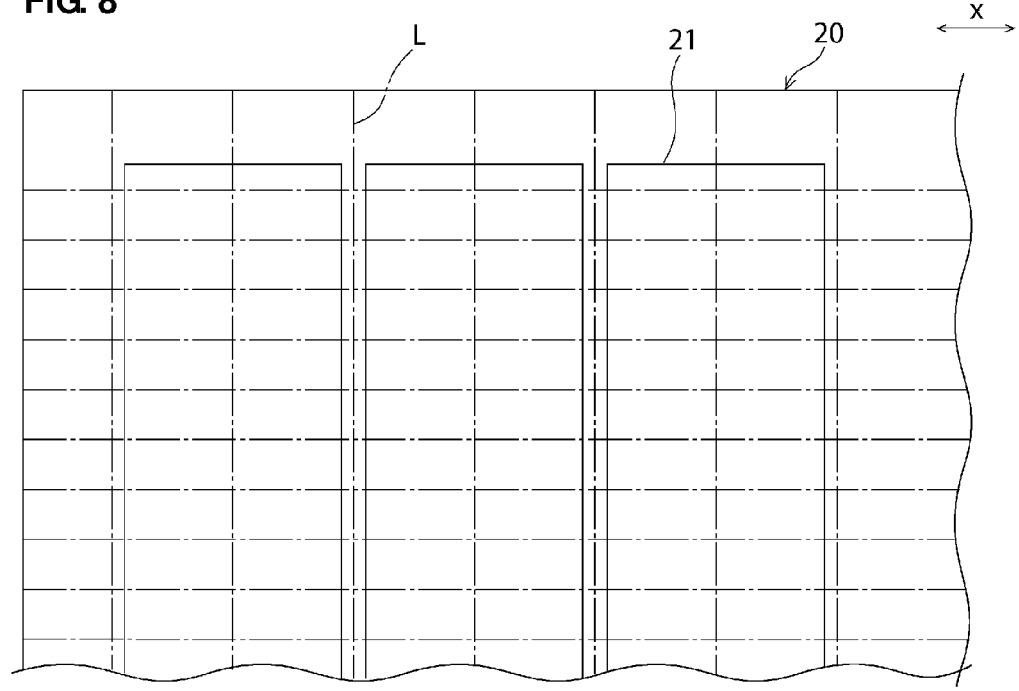

MONOLITHIC CERAMIC ELECTRONIC COMPONENT

BACKGROUND OF THE INVENTION

1. Field of the Invention

The present invention relates to a monolithic ceramic electronic component. In particular, the present invention relates to a monolithic ceramic electronic component including a ceramic sintered body including a plurality of first and second inner electrodes that are alternately disposed inside the ceramic sintered body to be opposed to each other with a ceramic layer interposed between the adjacent first and second inner electrodes.

2. Description of the Related Art

Monolithic ceramic electronic components, e.g., monolithic ceramic capacitors, have been used in many electronic devices, such as cellular phones and notebook personal computers.

A trend toward smaller sizes and larger capacities of monolithic ceramic capacitors has recently increased. Even in power supply circuits, for example, in which aluminum electrolytic capacitors and tantalum capacitors have been primarily used to date, monolithic ceramic capacitors having a large capacity of 10 µF to 100 µF have recently been used. Generally, an electrostatic capacity is proportional to the relative dielectric constant, the area in which inner electrodes are opposed to each other, and the number of stacked inner electrodes, while it is inversely proportional to the thickness of a dielectric layer. Therefore, various proposals have been made to obtain a larger electrostatic capacity while maintaining predetermined dimensions. In the monolithic ceramic capacitor having a large capacity, the thickness of the dielectric layer is reduced to 1 µm or less, and thus, a dielectric material, such as barium titanate, is required to have a grain size of 1 µm or less while maintaining high crystallinity. Further, the number of stacked inner electrodes is as high as 1000 in some cases, and a smooth electrode having a high coverage is required. In addition, the ceramic layers and the inner electrodes are integrally sintered into a monolithic structure in a manufacturing process. At that time, internal stress generated upon expansion and shrinkage during the sintering must be reduced in order to prevent structural defects.

In such a situation, monolithic ceramic electronic components, in which defects after firing, such as cracks and delamination, are avoided even when the thickness of the ceramic green sheets and the inner electrodes are reduced and a large number of layers are stacked, and methods of manufacturing them are described in the Japanese Unexamined Patent Application Publication No. 2003-318060, for example.

One example of methods for improving the performance of a monolithic ceramic electronic component is to develop a ceramic material having higher performance. However, a large amount of time and efforts are required to develop the ceramic material having higher performance.

Another example of methods for improving the performance of a monolithic ceramic electronic component is to reduce the thickness of each ceramic layer, to increase the number of stacked ceramic layers, and to increase an area where inner electrodes are opposed to each other.

When attempting to reduce a gap portion in which the inner electrodes are not disposed, so as to increase the area in which inner electrodes are opposed to each other, humidity resistance cannot be obtained at a sufficiently high level in some cases. In other words, there has been a problem in that it is difficult to obtain high performance and high humidity resistance.

SUMMARY OF THE INVENTION

To overcome the problems described above, preferred embodiments of the present invention provide a monolithic ceramic capacitor having a small size, high performance, and high humidity resistance.

A monolithic ceramic electronic component according to a preferred embodiment of the present invention preferably includes a parallelepiped ceramic sintered body and a plurality of first and second inner electrodes. The ceramic sintered body includes first and second surfaces, third and fourth surfaces, and fifth and sixth surfaces. The first and second surfaces extend in a first direction and a second direction. The second direction is perpendicular to the first direction. The third and fourth surfaces extend in a third direction and the first direction. The third direction is perpendicular to both the first and second directions. The fifth and sixth surfaces extend in the second and third directions. The ceramic sintered body includes a plurality of ceramic layers. The ceramic layers are stacked in the third direction. The first and second inner electrodes are alternately arranged inside the ceramic sintered body to be opposed to each other in the third direction with the ceramic layer interposed between the adjacent first and second inner electrodes. Each of the first and second inner electrodes includes a metal. The first and second inner electrodes are each arranged to be exposed to the third or fourth surface without being exposed to the fifth and sixth surfaces. Heterogeneous regions, including solid solutions of the metals included in the first and second inner electrodes and the ceramic sintered body, are arranged continuously in opposite end portions of the ceramic sintered body in the first direction to extend from one side end to an opposite side end of a region in which the first and second inner electrodes are disposed in the third direction.

According to a preferred embodiment of the present invention, preferably, the first direction is a lengthwise direction, the second direction is a widthwise direction, the third direction is a thickness direction, the first and second surfaces are first and second principal surfaces, the third and fourth surfaces are first and second lateral surfaces, and the fifth and sixth surfaces are first and second end surfaces. That is, the monolithic ceramic electronic component preferably includes a parallelepiped ceramic sintered body and a plurality of first and second inner electrodes. The ceramic sintered body includes first and second principal surfaces, first and second lateral surfaces, and first and second end surfaces. The first and second principal surfaces extend in a lengthwise direction and a widthwise direction. The widthwise direction is perpendicular to the lengthwise direction. The first and second lateral surfaces extend in a thickness direction and the lengthwise direction. The thickness direction is perpendicular to both the lengthwise direction and the widthwise direction. The first and second end surfaces extend in the widthwise direction and the thickness direction. The ceramic sintered body includes a plurality of ceramic layers. The ceramic layers are stacked in the thickness direction. The first and second inner electrodes are alternately arranged inside the ceramic sintered body to be opposed to each other in the thickness direction with the ceramic layer interposed between the adjacent first and second inner electrodes. Each of the first and second inner electrodes includes a metal. The first and second inner electrodes are each arranged to be exposed to the first or second lateral surface without being exposed to the first and second end surfaces. Heterogeneous regions, which include solid solutions of the metals included in the first and second inner electrodes and the ceramic sintered body, are arranged continuously in opposite end portions of the ceramic sintered body in the lengthwise direction to extend from a one side end to an opposite side end of a region in which the first and second inner electrodes are disposed in the thickness direction.

In another preferred embodiment of a monolithic ceramic electronic component according to the present invention, preferably, the first direction is a lengthwise direction, the second direction is a thickness direction, the third direction is a widthwise direction, the first and second surfaces are first and second lateral surfaces, the third and fourth surfaces are first and second principal surfaces, and the fifth and sixth surfaces are first and second end surfaces.

In still another preferred embodiment of a monolithic ceramic electronic component according to the present invention, preferably, each of the opposite end portions of the ceramic sintered body in the first direction includes a side gap portion in which the first and second inner electrodes are not disposed, and an inner layer portion other than the side gap portion. The heterogeneous region is provided in both the side gap portion and the inner layer portion. With such a feature, humidity resistance of the monolithic ceramic electronic component is further increased.

In still another preferred embodiment of a monolithic ceramic electronic component according to the present invention, the metal dissolved in a solid state in the heterogeneous region is preferably at least one among Ni, Mg, B, Mn, Li, Si, Ti and Ba, for example.

In still another preferred embodiment of a monolithic ceramic electronic component according to the present invention, a thickness of the ceramic layer in the third direction is preferably about 0.8 μm or less, for example. With such a feature, the continuity of the heterogeneous region in the third direction is increased. Thus, the humidity resistance of the monolithic ceramic electronic component is further increased.

In still another preferred embodiment of a monolithic ceramic electronic component according to the present invention, in cross-sections of the ceramic sintered body cut along planes passing end portions of the first and second inner electrodes in the first direction and extending parallel to the fifth and sixth surfaces, the heterogeneous regions are preferably each arranged to occupy an area of about 88% or more, for example, of a region where the first and second inner electrodes are opposed to each other. With such a feature, the humidity resistance of the monolithic ceramic electronic component is further increased.

In still another preferred embodiment of a monolithic ceramic electronic component according to the present invention, each of the opposite end portions of the ceramic sintered body in the first direction preferably includes a side gap portion in which the first and second inner electrodes are not disposed, and an inner layer portion other than the side gap portion, and a ratio of a length of the side gap portion to a length of the ceramic sintered body in the first direction is preferably about 30% or less, for example. In the case described above, the humidity resistance of the monolithic ceramic electronic component tends to be reduced. Preferred embodiments of the present invention capable of increasing the humidity resistance are thus particularly effective when applied to such a case.

In still another preferred embodiment of a monolithic ceramic electronic component according to the present invention, each of the opposite end portions of the ceramic sintered body in the first direction preferably includes a side gap portion in which the first and second inner electrodes are not disposed, and an inner layer portion other than the side gap portion, and a length of the side gap portion in the first direction is preferably about 30 μm or less, for example. In the case described above, the humidity resistance of the monolithic ceramic electronic component tends to be reduced. Preferred embodiments of the present invention capable of increasing the humidity resistance are thus particularly effective when applied to such a case.

In various preferred embodiments of the present invention, the heterogeneous regions, which include solid solutions of the metals included in the first and second inner electrodes and the ceramic sintered body, are provided continuously in the opposite end portions of the ceramic sintered body in the first direction to extend from one side end to the opposite side end of the region in which the first and second inner electrodes are disposed in the third direction. The heterogeneous regions exhibit lower moisture permeability than the ceramic layers. Accordingly, moisture can be effectively prevented from entering the monolithic ceramic electronic component through both the end portions of the ceramic sintered body in the first direction. Thus, it is possible to provide the monolithic ceramic capacitor having a small size, high performance, and high humidity resistance.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a schematic sectional view taken along a line III-III in FIG. 2.

FIG. 4 is a schematic sectional view taken along a line IV-IV in FIG. 2.

FIG. 7 is an enlarged schematic sectional view of a portion VII in FIG. 5.

FIG. 8 is a schematic plan view of a ceramic green sheet on which conductor patterns are printed.

DETAILED DESCRIPTION OF THE PREFERRED EMBODIMENTS

First Preferred Embodiment

A ceramic electronic component 2, illustrated in FIG. 1, will be described below as one of the preferred embodiments of the present invention. However, it is to be noted that the ceramic electronic component of the present invention is not limited to the ceramic electronic component 2.

Figure 1:
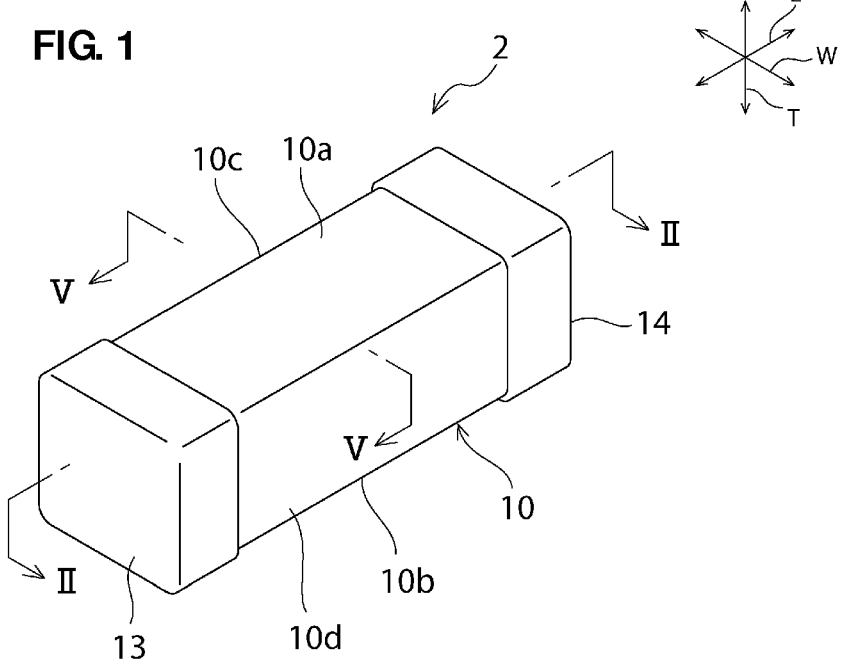
FIG. 1 is a schematic perspective view of a ceramic electronic component according to a preferred embodiment of the present invention.
Figure 2:
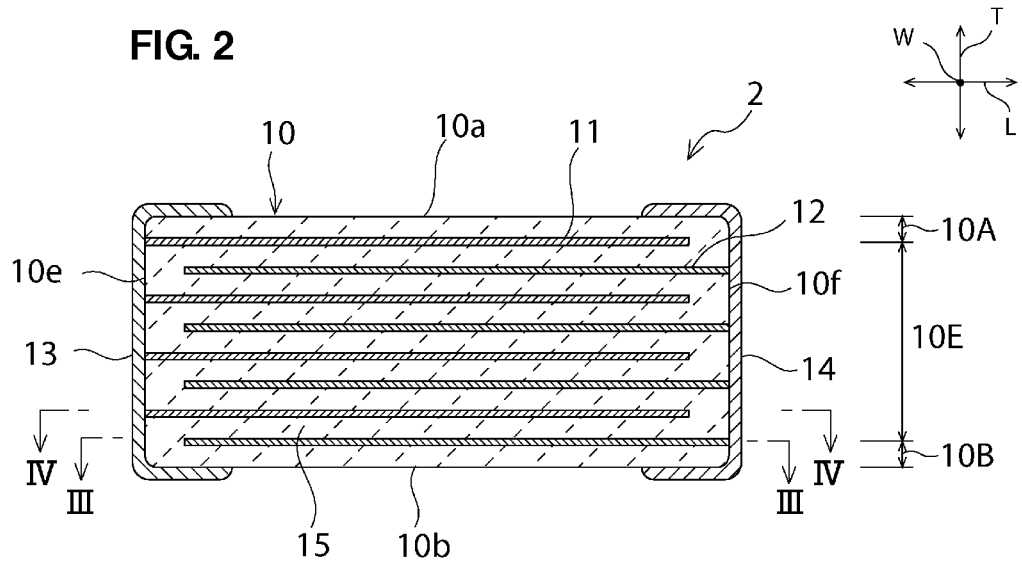
FIG. 2 is a schematic sectional view taken along a line II-II in FIG. 1.
Figure 5:
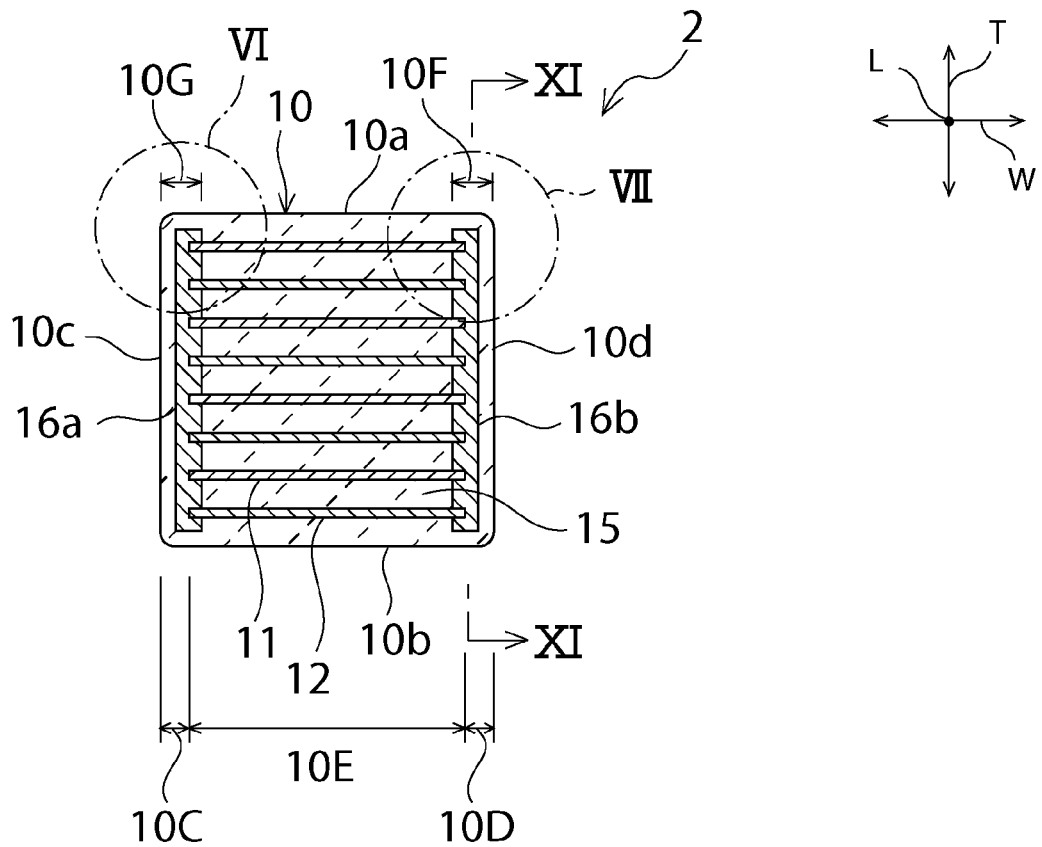
FIG. 5 is a schematic sectional view taken along a line V-V in FIG. 1.
Figure 6:
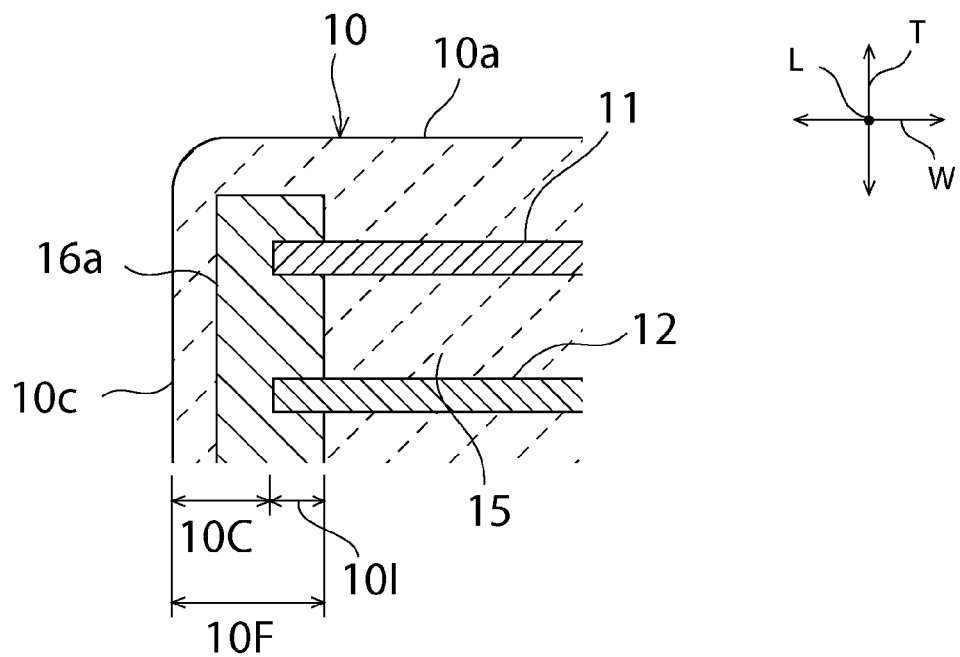
FIG. 6 is an enlarged schematic sectional view of a portion VI in FIG. 5.

FIG. 1 is a schematic perspective view of a ceramic electronic component according to a first preferred embodiment of the present invention. FIG. 2 is a schematic sectional view taken along a line II-II in FIG. 1. FIG. 3 is a schematic sectional view taken along a line III-III in FIG. 2. FIG. 4 is a schematic sectional view taken along a line IV-IV in FIG. 2. FIG. 5 is a schematic sectional view taken along a line V-V in FIG. 1. FIG. 6 is an enlarged schematic sectional view of a portion VI in FIG. 5. FIG. 7 is an enlarged schematic sectional view of a portion VII in FIG. 5.

As illustrated in FIG. 1, the ceramic electronic component 2 according to the present preferred embodiment preferably includes a ceramic sintered body 10 having a parallelepiped shape. The ceramic sintered body 10 includes first and second principal surfaces 10a and 10b (first and second surfaces), first and second lateral surfaces 10c and 10d (third and fourth surfaces), and first and second end surfaces 10e and 10f (fifth and sixth surfaces). The first and second principal surfaces 10a and 10b (first and second surfaces) extend in a lengthwise direction L (first direction) and a widthwise direction W (second direction). The first and second lateral surfaces 10c and 10d (third and fourth surfaces) extend in the lengthwise direction L (first direction) and a thickness direction T (third direction). The first and second end surfaces 10e and 10f (fifth and sixth surfaces) extend in the widthwise direction W (second direction) and the thickness direction T (third direction).

The ceramic sintered body 10 includes a ceramic material. In this preferred embodiment, the ceramic sintered body 10 preferably includes, in addition to the ceramic material, firing aids such as Si and glass components, for example. Preferable examples of the glass components, as the firing aids, include a silicate glass, a borate glass, a borosilicate glass, and a phosphate glass, which contain alkali metal components and alkaline earth metal components, for example.

The type of the ceramic material can be selected, as appropriate, depending on the functions required for the ceramic electronic component 2.

When the ceramic electronic component 2 to be manufactured is a capacitor, for example, the ceramic sintered body 10 may be made of a dielectric ceramic. Preferable examples of the dielectric ceramic include, e.g., $BaTiO_3$, $CaTiO_3$, $SrTiO_3$, and $CaZrO_3$. Auxiliary components, e.g., a Mn compound, a Fe compound, a Cr compound, a Co compound, and a Ni compound, may preferably be added to the dielectric ceramic, as appropriate.

When the ceramic electronic component 2 to be manufactured is a ceramic piezoelectric element, for example, the ceramic sintered body 10 may be made of a piezoelectric ceramic. Preferable examples of the piezoelectric ceramic include a PZT (lead zirconate titanate)-based ceramic and other suitable piezoelectric ceramic materials.

When the ceramic electronic component 2 to be manufactured is a thermistor element, for example, the ceramic sintered body 10 may be made of a semiconductor ceramic. Preferable examples of the semiconductor ceramic include a spinel ceramic and other suitable semiconductor ceramic materials.

When the ceramic electronic component 2 to be manufactured is an inductor element, for example, the ceramic sintered body 10 may be made of a magnetic ceramic. Preferable examples of the magnetic ceramic include a ferrite ceramic and other suitable magnetic ceramic materials.

As illustrated in FIGS. 2 to 5, a plurality of first and second inner electrodes 11 and 12 are disposed inside the ceramic sintered body 10. The first and second inner electrodes 11 and 12 are each disposed parallel or substantially parallel to the first and second principal surfaces 10a and 10b. Each of the first and second inner electrodes 11 and 12 has a rectangular or substantially rectangular shape in plan view. The plurality of first and second inner electrodes 11 and 12 are alternately arranged to be opposed to each other in the thickness direction T. In other words, the first and second inner electrodes 11 and are arranged to face each other in the thickness direction T such that a plurality of ceramic layers 15 disposed inside the ceramic sintered body 10 are interposed respectively between the adjacent first and second inner electrodes 11 and 12. A thickness of the ceramic layer 15 in the thickness direction T is not particularly limited. The thickness of the ceramic layer 15 in the thickness direction T is preferably about 0.8 μm or less, for example.

The first inner electrodes 11 are exposed to the first end surface 10e, but they are not exposed to the second end surface 10f, the first and second principal surfaces 10a and 10b, and the first and second lateral surfaces 10c and 10d. On the other hand, the second inner electrodes 12 are exposed to the second end surface 10f, but they are not exposed to the first end surface 10e, the first and second principal surfaces 10a and 10b, and the first and second lateral surfaces 10c and 10d.

A first outer electrode 13 is disposed on the first end surface 10e. The first outer electrode 13 is connected to the first inner electrodes 11. On the other hand, a second outer electrode 14 is disposed on the second end surface 10f. The second outer electrode 14 is connected to the second inner electrodes 12.

Materials of the first and second inner electrodes 11 and 12 and the first and second outer electrodes 13 and 14 are not particularly limited as long as the materials are electrically conductive. The first and second inner electrodes 11 and 12 and the first and second outer electrodes 13 and 14 may preferably be made of, e.g., a metal such as Ag, Au, Pt, Pd, Ni, Cr, Al or Cu, or an alloy containing one or more of those metals. Further, the first and second inner electrodes 11 and 12 and each of the first and second outer electrodes 13 and 14 may preferably include a plurality of laminated conductive films.

As illustrated in FIGS. 2 to 5, the ceramic sintered body 10 includes first and second outer layer portions 10A and 10B, first and second gap portions 10C and 10D, and an inner layer portion 10E.

The first and second outer layer portions 10A and 10B are portions that are located outside a portion in which the first and second inner electrodes 11 and 12 are disposed in an opposing direction (=thickness direction T) in which the first and second inner electrodes 11 and 12 are opposed to each other. More specifically, in the present preferred embodiment, the first and second outer layer portions 10A and 10B are respectively disposed at opposite end portions of the ceramic sintered body 10 in the thickness direction T.

The first and second gap portions 10C and 10D are portions in which the first and second inner electrodes 11 and 12 are not disposed when viewed from the opposing direction (=thickness direction T) in which the first and second inner electrodes 11 and 12 are opposed to each other. More specifically, in the present preferred embodiment, the first and second gap portions 10C and 10D are respectively disposed at opposite end portions of the ceramic sintered body 10 in the widthwise direction W.

The inner layer portion 10E is a portion of the ceramic sintered body 10 except for the first and second outer layer portions 10A and 10B and the first and second gap portions 10C and 10D. More specifically, in the present preferred embodiment, the inner layer portion 10E is preferably located in a region of the ceramic sintered body 10 except for the opposite end portions in the thickness direction T and the opposite end portions in the widthwise direction W. Thus, the inner layer portion 10E includes a portion in which the first and second inner electrodes 11 and 12 are opposed to each other in the thickness direction T and a portion in which only one of the first or second inner electrodes 11 or 12 is disposed when viewed from the thickness direction T.

In the present preferred embodiment, as illustrated in FIGS. 5 to 7, heterogeneous regions 16a and 16b are respectively provided in opposite end portions 10G and 10F in the widthwise direction W (i.e., in end portions close to first and second lateral surfaces 10c and 10d of the ceramic sintered body 10). The heterogeneous regions 16a and 16b preferably include solid solutions that include metals included in the first and second inner electrodes 11 and 12 and by a metal included in the ceramic sintered body 10. Therefore, a metal component included in the ceramic layer 15 is also included in the heterogeneous regions 16a and 16b. More specifically, in the present preferred embodiment, the heterogeneous regions 16a and 16b preferably include portions in which the metals included in the first and second inner electrodes 11 and 12 are dissolved in a solid state in the ceramic sintered body 10, and portions in which the component of the ceramic sintered body 10 is dissolved in a solid state in the first and second inner electrodes 11 and 12.

The heterogeneous regions 16a and 16b are arranged to continuously extend, in the thickness direction T, from one side end to an opposite side end of the inner layer portion 10E in which the first and second inner electrodes 11 and 12 are disposed. Here, the heterogeneous regions 16a and 16b have lower moisture permeability than the ceramic layers 15. Further, the heterogeneous regions 16a and 16b have a lower sintering temperature, are more likely to develop densification, and have a smaller number of voids. For this reason, moisture is effectively prevented from entering the monolithic ceramic electronic component 2 through the end portions 10G and 10F of the ceramic sintered body 10. Thus, even when a smaller size and higher performance are intended by reducing sizes of the gap portions 10C and 10D and by increasing areas where the first and second inner electrodes 11 and 12 are opposed to each other, it is possible to effectively prevent degradation of the performance, which may be caused with the ingress of moisture into the monolithic ceramic electronic component 2. Accordingly, not only the smaller size and the higher performance, but also higher humidity resistance is obtained.

In the present preferred embodiment, as described above, higher humidity resistance is achieved as a result of the heterogeneous regions 16a and 16b. Therefore, the sizes of the gap portions 10C and 10D can be reduced. For example, a ratio of lengths of the gap portions 10C and 10D to a length of the ceramic sintered body 10 in the widthwise direction W may preferably be reduced to about 30% or below, for example. Further, the lengths of the gap portions 10C and 10D in the widthwise direction W may preferably be set to be about 30 μm or less, for example. Thus, it is possible to obtain an even smaller size and even higher performance, as well as even higher humidity resistance. Additionally, a preferred lower limit of the ratio of the lengths of the gap portions 10C and 10D to the length of the ceramic sintered body 10 in the widthwise direction W is about 3%, for example. A preferred lower limit of the lengths of the gap portions 10C and 10D in the widthwise direction W is preferably about 5 μm, for example. An even higher capacity can be achieved with the above-described configuration.

From the viewpoint of obtaining even higher humidity resistance, it is preferable that the heterogeneous regions 16a and 16b are continuously arranged from the one side end to the opposite side end in the thickness direction T with high uniformity. In more detail, thicknesses of the heterogeneous regions 16a and 16b in portions in which the first or second inner electrodes 11 or 12 are not disposed in the thickness direction T are preferably the same or substantially the same as those of the heterogeneous regions 16a and 16b in portions in which the first or second inner electrodes 11 or 12 are disposed in the thickness direction T. That is, even in the portions in which the first or second inner electrodes 11 or 12 are not disposed in the thickness direction T, the heterogeneous regions 16a and 16b preferably have the same or substantially the same thicknesses as those in the portions in which the first or second inner electrodes 11 or 12 are disposed. Thus, a thickness of the ceramic layer 15 is preferably reduced. In practice, the thickness of the ceramic layer 15 in the thickness direction T is preferably about 0.8 μm or less, for example.

Further, from the viewpoint of obtaining even higher humidity resistance, the heterogeneous regions 16a and 16b are preferably provided in the end portions 10F and 10G in not only the side gap portions 10C and 10D in which the first and second inner electrodes 11 and 12 are not disposed, but also in portions 10H and 10I other than the side gap portions 10C and 10D. Still further, the heterogeneous regions 16a and 16b are preferably arranged such that, in cross-sections of end portions of the first and second inner electrodes 11 and 12 in the lengthwise direction L and extending in the widthwise direction W and the thickness direction T, each of the heterogeneous regions 16a and 16b occupy an area of about 88% or more, for example, of the region in which the first and second inner electrodes are opposed to each other. The heterogeneous regions 16a and 16b may preferably be provided in the entire or substantially the entire side gap portions 10C and 10D.

A zone in which each of the heterogeneous regions 16a and 16b is provided can be specified by observing a cross-section of the monolithic ceramic electronic component 2, which has been exposed by cutting, with an electron microscope.

Metals dissolved in a solid state in the heterogeneous regions 16a and 16b are not particularly limited. For example, at least one metal among Ni, Mg, B, Mn, Li, Si, Ti and Ba may preferably be dissolved in a solid state in the heterogeneous regions 16a and 16b. In particular, Si, Li and B are more preferably dissolved in a solid state in the heterogeneous regions 16a and 16b. The reason is that those metals are effective to lower the melting point, facilitate the progress of sintering, and promote densification.

One non-limiting example of a method of manufacturing the monolithic ceramic electronic component 2 according to the present preferred embodiment will be described below with reference to FIGS. 8 to 11.

First, a ceramic green sheet 20, illustrated in FIG. 8, is formed. A method of forming the ceramic green sheet 20 is not particularly limited. The ceramic green sheet 20 can preferably be formed by, e.g., a die coater, a gravure coater, or a micro-gravure coater.

Next, conductor patterns 21 are formed on the ceramic green sheet 20. The conductor patterns 21 form the first and second inner electrodes 11 and 12. A method of forming the conductor patterns 21 is not particularly limited. The conductor patterns 21 can preferably be formed by, e.g., a screen printing method, an ink jet method, or a gravure printing method.

Next, the ceramic green sheets 20, including the conductor patterns 21 formed thereon, are stacked to form a laminate. In more detail, a plurality of ceramic green sheets 20, each not including the conductor patterns 21 formed thereon, are stacked on one another. Then, a plurality of ceramic green sheets 20, each including the conductor patterns 21 formed thereon, are stacked in such a state that the ceramic green sheets 20 are alternately shifted to one side and to the other side in an x-direction. Further, a plurality of ceramic green sheets 20, each not including the conductor patterns 21 formed thereon, are successively stacked, thus completing the laminate. Here, the ceramic green sheets 20, each not including the conductor patterns 21 formed thereon, which are stacked first and last, form the first and second outer layer portions 10A and 10B.

Figure 9:
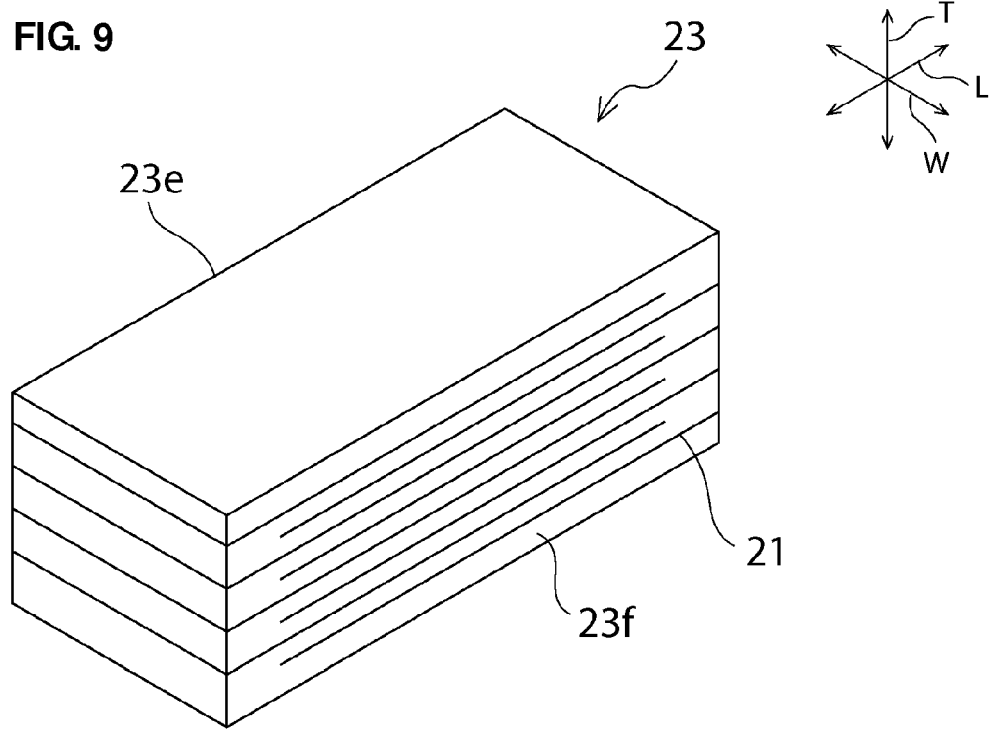
FIG. 9 is a schematic perspective view of a ceramic member.

Next, the laminate is cut along cut lines L illustrated in FIG. 8, thereby forming a plurality of parallelepiped ceramic members 23, one of which is illustrated in FIG. 9. The laminate can preferably be cut by dicing or push cutting, for example. Alternatively, the laminate can preferably be cut by using a laser, for example.

Figure 10:
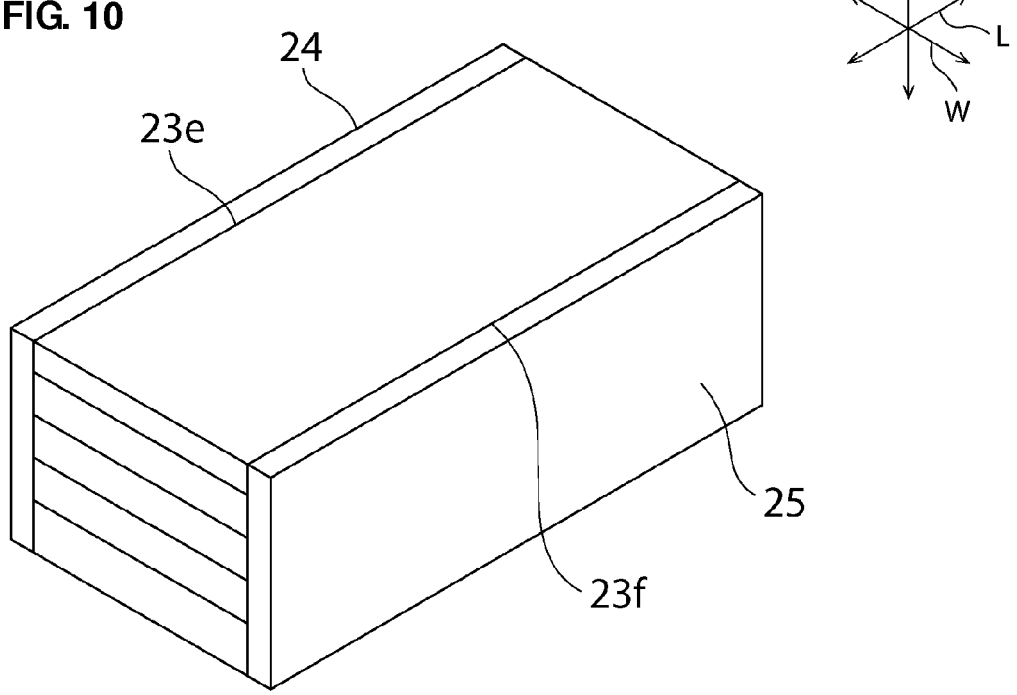
FIG. 10 is a schematic perspective view illustrating a step of forming ceramic layers on both lateral surfaces.

Next, as illustrated in FIG. 10, ceramic layers 24 and 25 are formed on lateral surfaces 23e and 23f of the ceramic member 23, respectively, so as to cover the lateral surfaces 23e and 23f. The ceramic layers 24 and 25 form the first and second side gap portions 10C and 10D, respectively.

A method of forming the ceramic layers 24 and 25 is not particularly limited. The ceramic layers 24 and 25 can preferably be formed by, e.g., a printing method such as screen printing, an ink jet method, a coating method such as gravure coating, or an atomizing method.

Next, the ceramic member 23 including the ceramic layers 24 and 25 formed thereon is sintered. The ceramic sintered body 10 is thereby completed.

Finally, by forming the first and second outer electrodes 13 and 14, the ceramic electronic component 2 is completed. A method of forming the first and second outer electrodes 13 and 14 is not particularly limited. The first and second outer electrodes 13 and 14 may preferably be formed, for example, by coating a conductive paste and then baking it. In such a case, the conductive paste may be coated before firing the ceramic member 23, and the first and second outer electrodes 13 and 14 may be formed at the same time as the firing. As another example, the first and second outer electrodes 13 and 14 may preferably be formed by, e.g., plating.

The ceramic electronic component 2 according to the above-described first preferred embodiment was fabricated under conditions, given below, in accordance with the method described above in the first preferred embodiment.

A heterogeneous region in each of fabricated samples was observed, and a rate of the heterogeneous region was measured. Specifically, the rate of the heterogeneous region was measured as follows.

Composition of the ceramic layer: $BaTiO_3$ added with Mg (amounts of Mg added to Samples 1 to 5 were about 0 mol %, about 2 mol %, about 3 mol %, about 4 mol % and about 6 mol %, respectively)

Thickness of the ceramic layer: about 0.8 μm
Material of the inner electrode: Ni
Thickness of the inner electrode: about 0.5 μm
Layer number of the inner electrodes: about 400
Firing temperature: about 1200° C.
Firing atmosphere: reducing atmosphere (oxygen partial pressure at about 1200° C.: about $1.05 \times 10^{-9}$ MPa)
Material of the outer electrode: Cu
Thickness of the outer electrode: about 40 μm
Baking temperature for the outer electrode: about 850° C.
Baking time for the outer electrode: about 1 hour
Bake atmosphere for the outer electrode: reducing atmosphere In more detail, a portion of each sample on the side closer to a lateral surface thereof was first ground parallel or substantially parallel to the lateral surface and observed repeatedly until the heterogeneous region was confirmed with the observation.

Figure 11:
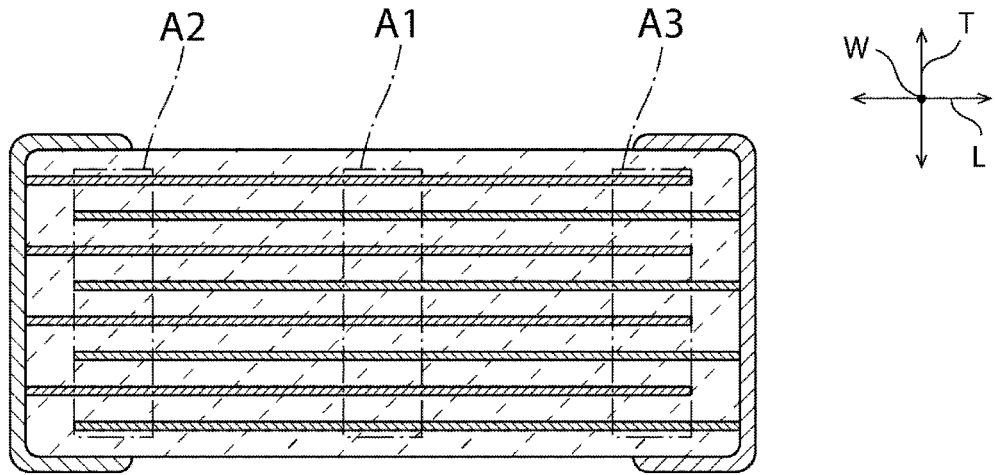
FIG. 11 is a schematic sectional view, taken along a line XI-XI in FIG. 5, to explain locations where heterogeneous regions in a preferred embodiment of the present invention are observed.

Next, an image of a cross-section exposed with the grinding was taken for each of a central region A1 and end regions A2 and A3, illustrated in FIG. 11, by using a scanning electron microscope (JSM-5800 made by JOEL Ltd.) at an acceleration voltage of about 20 kV, a magnification of about 15000, and accuracy of ±about 0.01 μm. The image-taking by the scanning electron microscope was performed such that, for each of the central region A1 and the end regions A2 and A3, an image was taken by interconnecting three upper, middle and lower portions at respective centers in the lengthwise direction L with a plurality of view ranges, each having a size of about 100 μm (lengthwise direction L)×about 75 μm (thickness direction T), in the thickness direction T.

Next, whether the heterogeneous region was continuously formed or not was confirmed based on photos taken by the electron microscope for the regions in which the first and second inner electrodes were disposed. More specifically, when the heterogeneous region was continuous between the adjacent first and second inner electrodes in all the view ranges, the continuity was determined to be "yes". When the heterogeneous region was discontinuous anywhere, the continuity was determined to be "no". The determined results are indicated in Table 1 given below.

Next, the heterogeneous region was specified by executing a binarizing process of the photos taken by the electron microscope. A proportion of an area occupied by the heterogeneous region in each view range was then calculated as a rate of the heterogeneous region. The calculated results are indicated in Table 1 given below.

For each sample, a humidity resistance load test was performed as follows. In more detail, a voltage of about 4 V was applied to each sample for about 1000 hours in a state that the sample was placed in a high-temperature and high-humidity atmosphere at about 85° C. and humidity of about 85%. Thereafter, an insulation resistance (IR) of each sample was measured. As a result of the measurement, a sample having the insulation resistance of about 1 MΩ or more was determined to be an acceptable product, and a sample having the insulation resistance of less than about 1 MΩ was determined to be a defective product. A failure rate for each Sample type (number of defective products/total sample number) is indicated in Table 1 given below.

TABLE 1

|  | Amount of added Mg (mol %) | Continuity | Rate of heterogeneous region (%) | Number of defectives with humidity resistance test |
|---|---|---|---|---|
| Sample 1 | 0 | no | 0 | 23/72 |
| Sample 2 | 2 | yes | 63 | 5/72 |
| Sample 3 | 3 | yes | 78 | 1/72 |
| Sample 4 | 4 | yes | 88 | 0/72 |
| Sample 5 | 6 | yes | 94 | 0/72 |

As represented in Table 1, superior humidity resistance was obtained in Samples 2 to 5 in which the heterogeneous region was continuously formed. From such a result, it is understood that the humidity resistance can be improved by forming the heterogeneous region in a continuous arrangement. It is also understood that, from the viewpoint of obtaining more superior humidity resistance, the rate of heterogeneous region is preferably about 60% or more, more preferably about 75% or more, even more preferably about 80% or more, and most preferably about 88% or more, for example.

Figure 12:
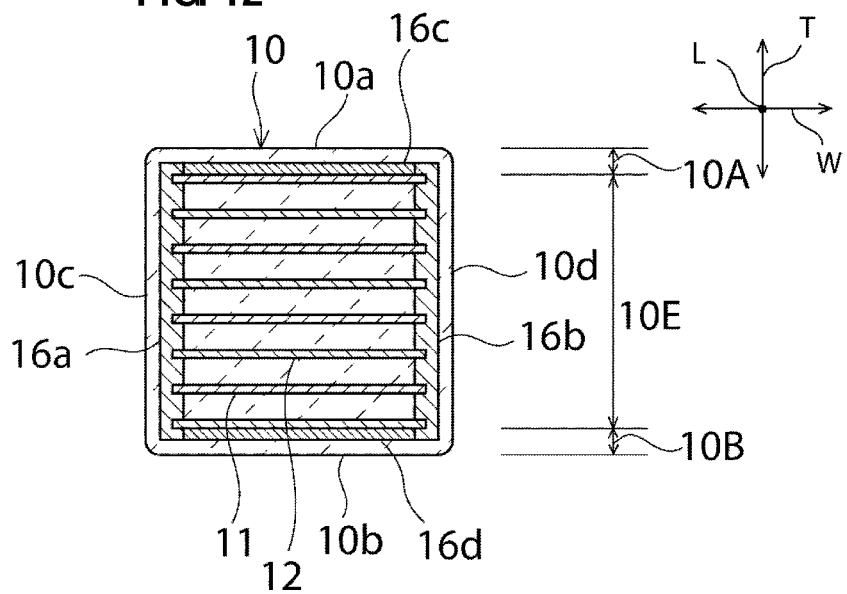
FIG. 12 is a schematic sectional view of a ceramic electronic component according to a modification of a preferred embodiment of the present invention.

As illustrated in FIG. 12, preferably, heterogeneous regions 16c and 16d are further provided in the outer layer portions 10A and 10B, respectively. More preferably, the heterogeneous regions 16c and 16d are also continuously arranged in the outer layer portions 10A and 10B. With this modification, more superior humidity resistance is achieved.

Second Preferred Embodiment

A ceramic electronic component 1, illustrated in FIG. 13, will be described below as another one of preferred embodiments of the present invention. However, it is to be noted that the ceramic electronic component of the present invention is not limited to the ceramic electronic component 1. In the following description of a second preferred embodiment of the present invention, members having functions substantially in common to those in the first preferred embodiment are denoted by common symbols.

Figure 13:
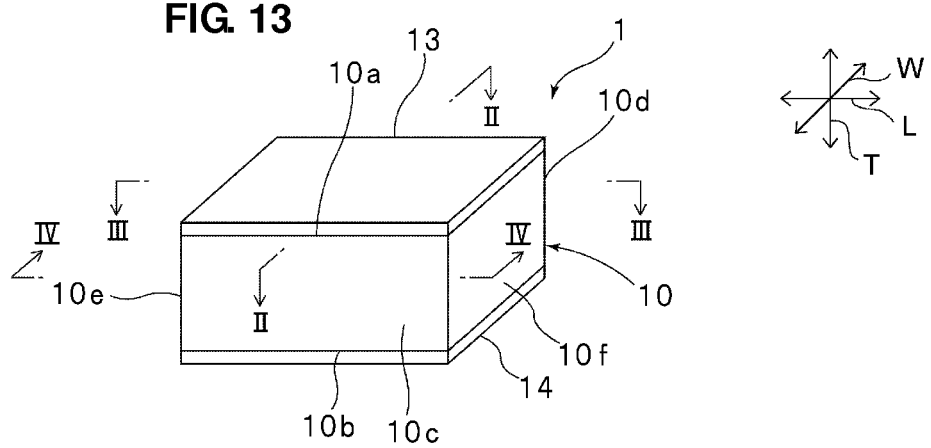
FIG. 13 is a schematic perspective view of a ceramic electronic component according to another preferred embodiment of the present invention.
Figure 14:
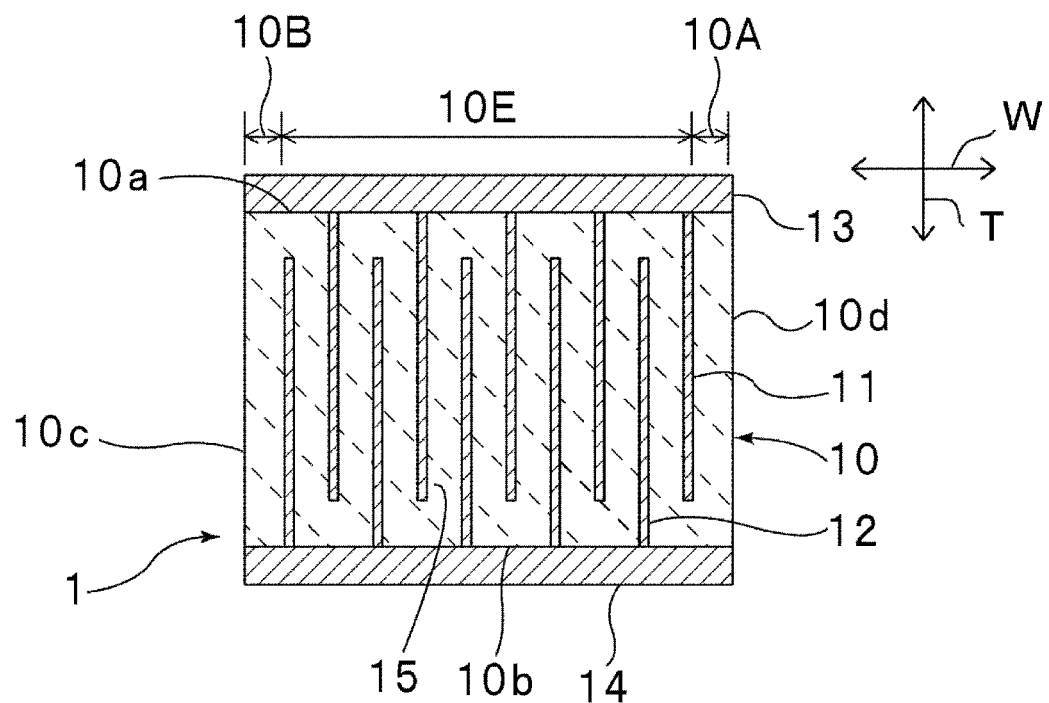
FIG. 14 is a schematic sectional view taken along a line II-II in FIG. 13.
Figure 15:
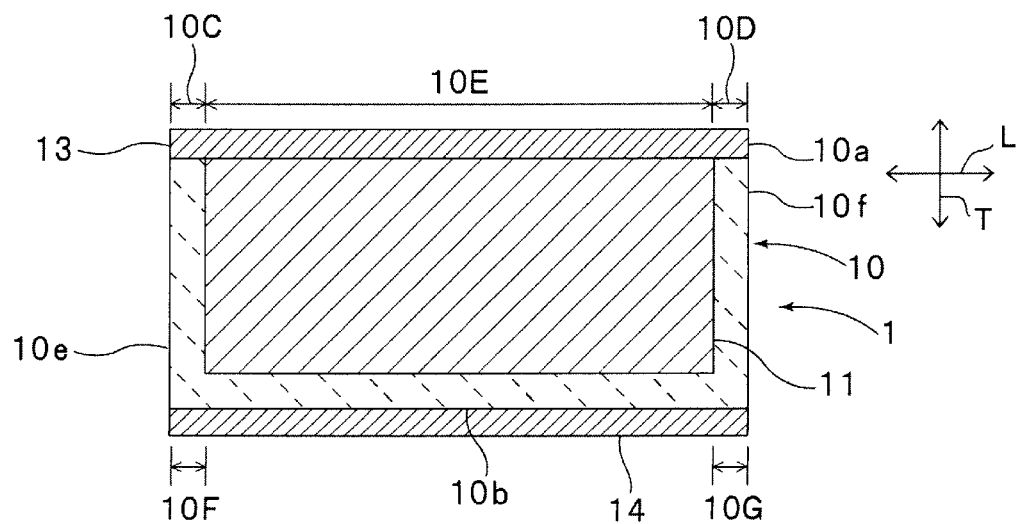
FIG. 15 is a schematic sectional view taken along a line III-III in FIG. 13.
Figure 16:
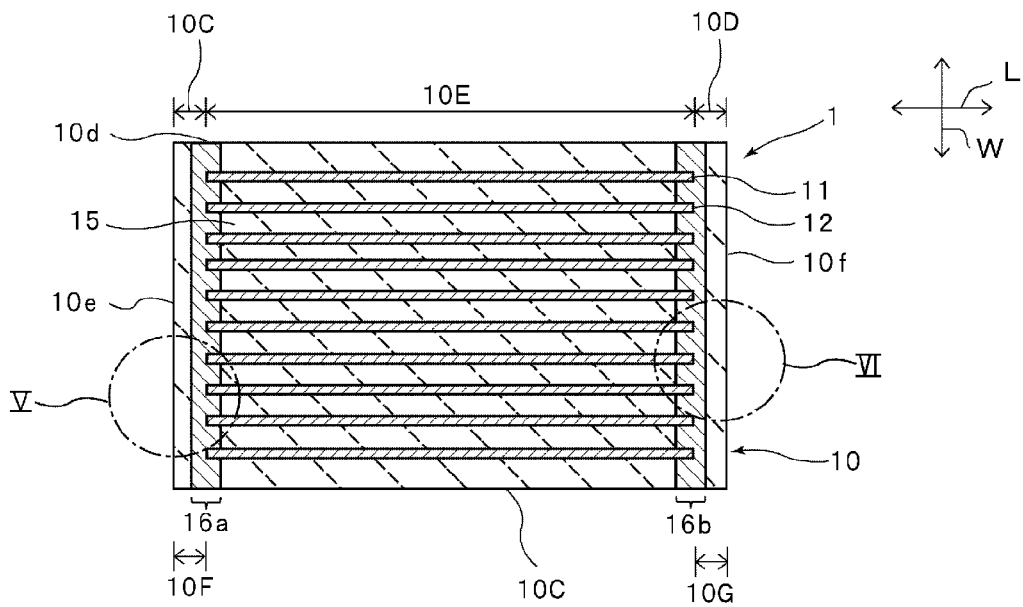
FIG. 16 is a schematic sectional view taken along a line IV-IV in FIG. 13.

FIG. 13 is a schematic perspective view of the ceramic electronic component according to the present preferred embodiment. FIG. 14 is a schematic sectional view taken along a line II-II in FIG. 13. FIG. 15 is a schematic sectional view taken along a line III-III in FIG. 13. FIG. 16 is a schematic sectional view taken along a line IV-IV in FIG. 13.

As illustrated in FIG. 13, the ceramic electronic component 1 according to the present preferred embodiment preferably includes a ceramic sintered body 10 having a parallelepiped shape. The ceramic sintered body 10 includes first and second principal surfaces 10a and 10b (third and fourth surfaces), first and second lateral surfaces 10c and 10d (first and second surfaces), and first and second end surfaces 10e and 10f (fifth and sixth surfaces). The first and second principal surfaces 10a and 10b (third and fourth surfaces) extend in a lengthwise direction L (first direction) and a widthwise direction W (third direction). The first and second lateral surfaces 10c and 10d (first and second surfaces) extend in the lengthwise direction L (first direction) and a thickness direction T (second direction). The first and second end surfaces 10e and 10f (fifth and sixth surfaces) extend in the widthwise direction W (third direction) and the thickness direction T (second direction).

It is to be noted that, in the present invention, the term "parallelepiped" includes a shape in which at least portions of corners and/or ridges are chamfered or rounded.

The ceramic sintered body 10 includes a ceramic material. In this preferred embodiment, the ceramic sintered body 10 preferably includes, in addition to the ceramic material, firing aids such as Si and glass components, for example. Preferable examples of the glass components, as the firing aids, include a silicate glass, a borate glass, a borosilicate glass, and a phosphate glass, which contain alkali metal components and alkaline earth metal components.

The type of the ceramic material can be selected, as appropriate, depending on the functions required for the ceramic electronic component 1.

When the ceramic electronic component 1 to be manufactured is a capacitor, for example, the ceramic sintered body 10 may preferably be made of a dielectric ceramic. Preferable examples of the dielectric ceramic include, e.g., $BaTiO_3$, $CaTiO_3$, $SrTiO_3$, and $CaZrO_3$. Auxiliary components, e.g., a Mn compound, a Fe compound, a Cr compound, a Co compound, and a Ni compound, may preferably be added to the dielectric ceramic.

When the ceramic electronic component 1 to be manufactured is a ceramic piezoelectric element, for example, the ceramic sintered body 10 may preferably be made of a piezoelectric ceramic. Preferable examples of the piezoelectric ceramic include a PZT (lead zirconate titanate)-based ceramic and other suitable piezoelectric ceramic materials.

When the ceramic electronic component 1 to be manufactured is a thermistor element, for example, the ceramic sintered body 10 may preferably be made of a semiconductor ceramic. Preferable examples of the semiconductor ceramic include a spinel ceramic and other suitable semiconductor ceramic materials.

When the ceramic electronic component 1 to be manufactured is an inductor element, for example, the ceramic sintered body 10 may preferably be made of a magnetic ceramic. Preferable examples of the magnetic ceramic include a ferrite ceramic and other suitable magnetic ceramic materials.

As illustrated in FIGS. 14 and 15, a plurality of first and second inner electrodes 11 and 12 are disposed inside the ceramic sintered body 10. The first and second inner electrodes 11 and 12 are each disposed parallel or substantially parallel to the first and second lateral surfaces 10c and 10d. Each of the first and second inner electrodes 11 and 12 preferably has a rectangular or substantially rectangular shape in plan view. The plurality of first and second inner electrodes 11 and 12 are alternately arranged to be opposed to each other in the widthwise direction W. In other words, the first and second inner electrodes 11 and 12 are arranged to face each other such that a plurality of ceramic layers 15 disposed inside the ceramic sintered body 10 are interposed respectively between the adjacent first and second inner electrodes 11 and 12 in the widthwise direction W. A thickness of the ceramic layer 15 in the widthwise direction W (third direction) is not particularly limited. The thickness of the ceramic layer 15 in the widthwise direction W is preferably about 0.8 μm or less, for example.

The first inner electrodes 11 are exposed to the first principal surface 10a, but they are not exposed to the second principal surface 10b, the first and second lateral surfaces 10c and 10d, and the first and second end surfaces 10e and 10f. On the other hand, the second inner electrodes 12 are exposed to the second principal surface 10b, but they are not exposed to the first principal surface 10a, the first and second lateral surfaces 10c and 10d, and the first and second end surfaces 10e and 10f.

A first outer electrode 13 is disposed on the first principal surface 10a. The first outer electrode 13 is connected to the first inner electrodes 11. On the other hand, a second outer electrode 14 is disposed on the second principal surface 10b. The second outer electrode 14 is connected to the second inner electrodes 12.

Materials of the first and second inner electrodes 11 and 12 and the first and second outer electrodes 13 and 14 are not particularly limited as long as the materials are electrically conductive. The first and second inner electrodes 11 and 12 and the first and second outer electrodes 13 and 14 may preferably be made of, e.g., a metal such as Ag, Au, Pt, Pd, Ni, Cr, Al or Cu, or an alloy containing one or more of those metals. Further, the first and second inner electrodes 11 and 12 and the first and second outer electrodes 13 and 14 may preferably include a plurality of laminated conductive films.

As illustrated in FIGS. 14 and 15, the ceramic sintered body 10 includes first and second outer layer portions 10A and 10B, first and second gap portions 10C and 10D, and an inner layer portion 10E.

The first and second outer layer portions 10A and 10B are located outside a portion in which the first and second inner electrodes 11 and 12 are disposed in an opposing direction (=widthwise direction W) in which the first and second inner electrodes 11 and 12 are opposed to each other. More specifically, in the present preferred embodiment, the first and second outer layer portions 10A and 10B are disposed respectively at opposite end portions of the ceramic sintered body 10 in the widthwise direction W.

The first and second gap portions 10C and 10D are portions in which the first and second inner electrodes 11 and 12 are both not disposed when viewed from the opposing direction (=widthwise direction W) in which the first and second inner electrodes 11 and 12 are opposed to each other. More specifically, in the present preferred embodiment, the first and second gap portions 10C and 10D are respectively disposed at opposite end portions of the ceramic sintered body 10 in the lengthwise direction L.

The inner layer portion 10E is a portion of the ceramic sintered body 10 except for the first and second outer layer portions 10A and 10B and the first and second gap portions 10C and 10D. More specifically, in the present preferred embodiment, the inner layer portion 10E is located in a region of the ceramic sintered body 10 except for the opposite end portions in the thickness direction T and the opposite end portions in the widthwise direction W. Thus, the inner layer portion 10E includes a portion in which the first and second inner electrodes 11 and 12 are opposed to each other in the widthwise direction W, and a portion in which only one of the first or second inner electrodes 11 or 12 are disposed when viewed from the thickness direction T.

Figure 17:
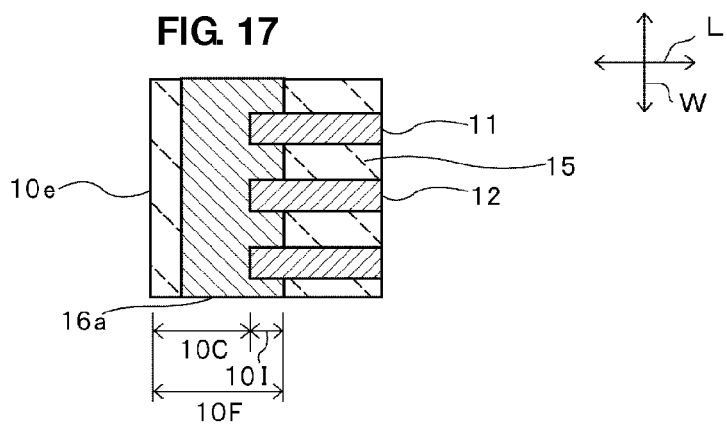
FIG. 17 is an enlarged schematic sectional view of a portion V in FIG. 16.
Figure 18:
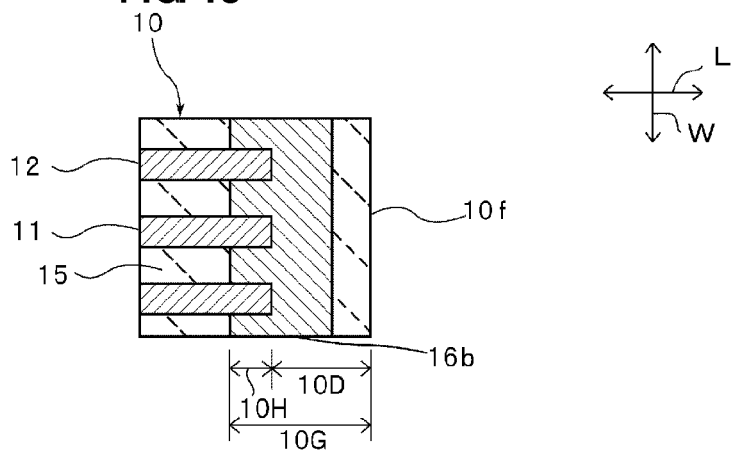
FIG. 18 is an enlarged schematic sectional view of a portion VI in FIG. 16.

In the present preferred embodiment, as illustrated in FIGS. 16 to 18, heterogeneous regions 16a and 16b are respectively provided in opposite end portions 10G and 10F in the lengthwise direction L (first direction) (i.e., in end portions close to first and second end surfaces 10e and 10f of the ceramic sintered body 10). The heterogeneous regions 16a and 16b include solid solutions in which the metals included in the first and second inner electrodes 11 and 12 are dissolved in a solid state in the ceramic sintered body 10. Metal components included in the ceramic layer 15 are also included in the heterogeneous regions 16a and 16b. The heterogeneous regions 16a and 16b are arranged to continuously extend from one side end to an opposite side end in the widthwise direction W (third direction). Here, the heterogeneous regions 16a and 16b have lower moisture permeability than the ceramic layers 15. Further, the heterogeneous regions 16a and 16b have a lower sintering temperature, are more likely to develop densification, and have a smaller number of voids. For that reason, moisture is effectively prevented from entering the monolithic ceramic electronic component 1 through the end portions 10G and 10F of the ceramic sintered body 10. Thus, even when a smaller size and higher performance are intended by reducing the sizes of the gap portions 10C and 10D and by increasing areas in which the first and second inner electrodes 11 and 12 are opposed to each other, it is possible to effectively prevent degradation of the performance, which may be caused with the ingress of moisture into the monolithic ceramic electronic component 1. Accordingly, not only the smaller size and the higher performance, but also higher humidity resistance are obtained.

In the present preferred embodiment, as described above, higher humidity resistance is achieved by providing the heterogeneous regions 16a and 16b. Therefore, the sizes of the gap portions 10C and 10D can be reduced. For example, a ratio of lengths of the gap portions 10C and 10D to a length of the ceramic sintered body 10 in the lengthwise direction L (first direction) may preferably be reduced to about 30% or below. Further, the lengths of the gap portions 10C and 10D in the lengthwise direction L (first direction) may preferably be set to be about 30 μm or less, for example. Thus, it is possible to obtain an even smaller size and even higher performance, as well as even higher humidity resistance. Additionally, a preferred lower limit of the ratio of the lengths of the gap portions 10C and 10D to the length of the ceramic sintered body 10 in the lengthwise direction L (first direction) is about 3%, for example. A preferred lower limit of the lengths of the gap portions 10C and 10D in the lengthwise direction L (first direction) is about 5 μm, for example. With this configuration, an even higher capacity is achieved.

From the viewpoint of obtaining even higher humidity resistance, it is preferable that the heterogeneous regions 16a and 16b extend continuously from the one side end to the opposite side end in the widthwise direction W (third direction) with high uniformity. In more detail, thicknesses of the heterogeneous regions 16a and 16b in portions in which the first or second inner electrodes 11 or are not disposed in the widthwise direction W are preferably the same or substantially the same as those of the heterogeneous regions 16a and 16b in portions in which the first or second inner electrodes 11 or 12 are disposed in the widthwise direction W. That is, even in the portions in which the first or second inner electrodes 11 or 12 are not disposed in the widthwise direction W, the heterogeneous regions 16a and 16b preferably have the same or substantially the same thicknesses as those in the portions in which the first or second inner electrodes 11 or 12 are disposed. Thus, a thickness of the ceramic layer 15 is preferably reduced. In practice, the thickness of the ceramic layer 15 in the widthwise direction W (third direction) is preferably about 0.8 μm or less, for example.

Further, from the viewpoint of obtaining even higher humidity resistance, the heterogeneous regions 16a and 16b are preferably provided in the end portions 10F and 10G in not only the gap portions 10C and 10D in which the first and second inner electrodes 11 and 12 are both not disposed, but also in portions 10H and 10I other than the gap portions 10C and 10D. Still further, the heterogeneous regions 16a and 16b are preferably arranged such that, in cross-sections of end portions of the first and second inner electrodes 11 and 12 in the lengthwise direction L and extending in the widthwise direction W and the thickness direction T, each of the heterogeneous regions 16a and 16b preferably occupy an area of about 88% or more, for example, of the region where the first and second inner electrodes 11 and 12 are opposed to each other. The heterogeneous regions 16a and 16b may preferably be provided in the entire or substantially the entire gap portions 10C and 10D.

A zone in which each of the heterogeneous regions 16a and 16b is provided can be specified by observing a cross-section of the monolithic ceramic electronic component 1, which has been exposed by cutting it, with an electron microscope.

Metals dissolved in a solid state in the heterogeneous regions 16a and 16b are not particularly limited. For example, at least one metal among Ni, Mg, B, Mn, Li, Si, Ti and Ba may preferably be dissolved in a solid state in the heterogeneous regions 16a and 16b. In particular, Si, Li and B are more preferably dissolved in a solid state in the heterogeneous regions 16a and 16b. The reason is that these metals are effective to lower the melting point, facilitate the progress of sintering, and promote densification.

One example of a method of manufacturing the monolithic ceramic electronic component 1 according to the present preferred embodiment will be described below with reference to FIGS. 19 to 23.

Figure 19:
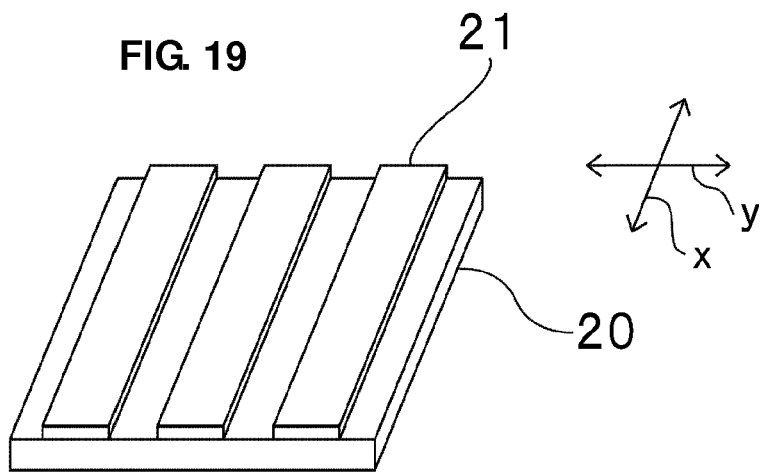
FIG. 19 is a schematic perspective view of a ceramic green sheet on which conductor patterns are printed.

First, a ceramic green sheet 20, illustrated in FIG. 19, is formed. A method of forming the ceramic green sheet 20 is not particularly limited. The ceramic green sheet 20 can preferably be formed by using, e.g., a die coater, a gravure coater, or a micro-gravure coater.

Next, a plurality of linear conductor patterns 21 extending in a first direction x parallel or substantially parallel to each other are formed on the ceramic green sheet 20. The conductor patterns 21 form the first and second inner electrodes 11 and 12. A method of forming the conductor patterns 21 is not particularly limited. The conductor patterns 21 can preferably be formed by, e.g., a screen printing method, an ink jet method, or a gravure printing method.

Figure 20:
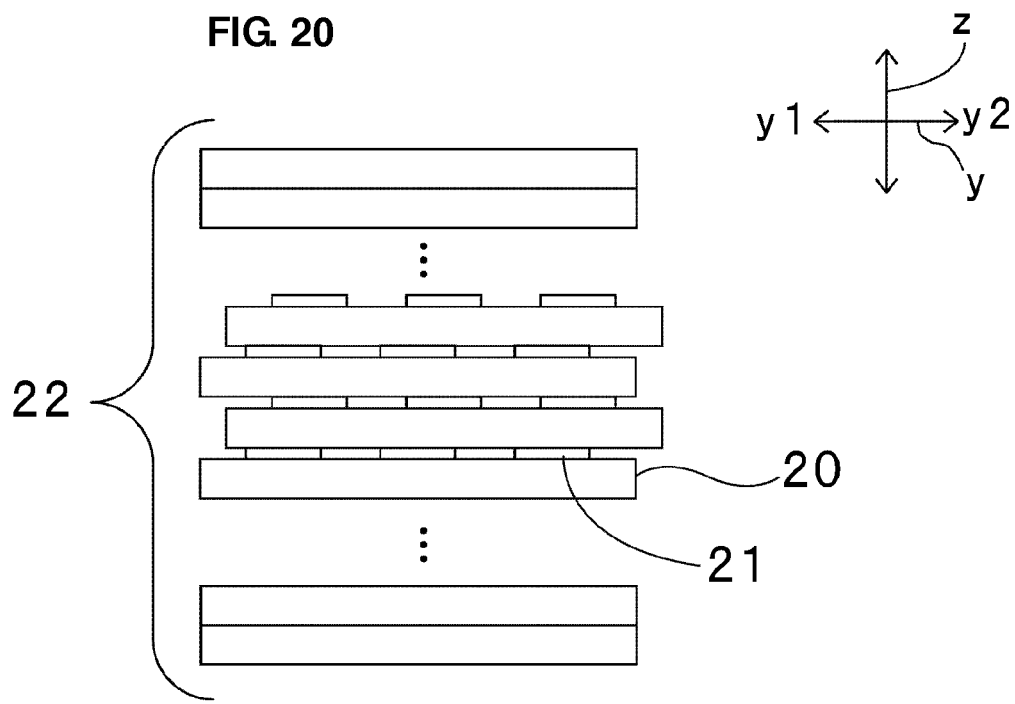
FIG. 20 is a schematic front view to explain a step of forming a laminate.

Next, as illustrated in FIG. 20, a laminate 22 is formed. In more detail, a plurality of ceramic green sheets 20, each not including the conductor patterns 21 formed thereon, are stacked on one another. Then, a plurality of ceramic green sheets 20, each including the conductor patterns 21 formed thereon, are stacked such that the ceramic green sheets 20 are alternately shifted to one side y1 and to the other side y2 in a second direction y that is perpendicular to the first direction x. Further, a plurality of ceramic green sheets 20, each not including the conductor patterns 21 formed thereon, are stacked successively, thus completing the laminate 22. Here, the ceramic green sheets 20, each not including the conductor patterns 21 formed thereon, which are stacked first and last, form the first and second outer layer portions 10A and 10B.

Figure 21:
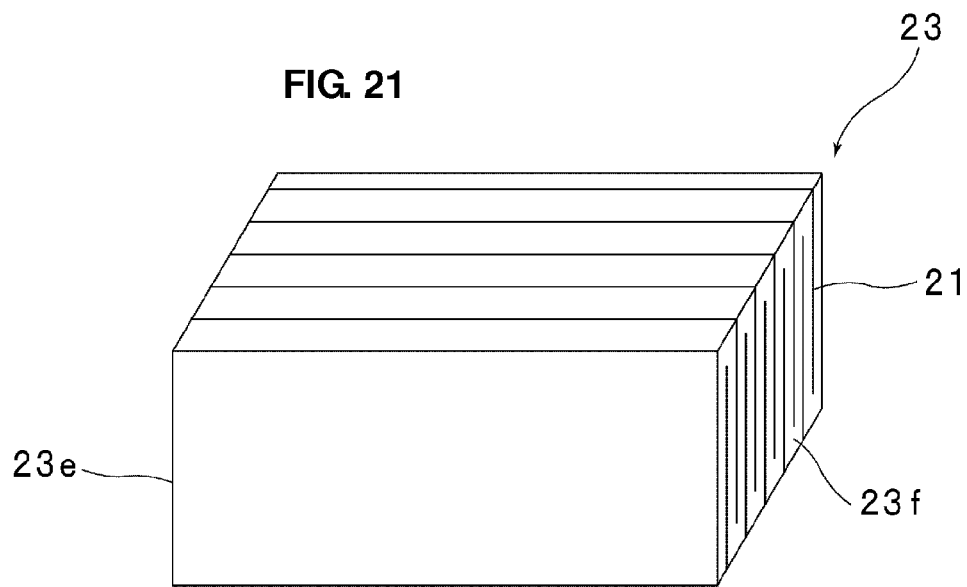
FIG. 21 is a schematic perspective view of a ceramic member.

Next, the laminate 22 after being pressed is cut along the first direction x and the second direction y, thereby forming a plurality of parallelepiped ceramic members 23, one of which is illustrated in FIG. 21. The laminate 22 can preferably be cut by dicing or push cutting, for example. Alternatively, the laminate 22 may preferably be cut by using a laser, for example.

Figure 22:
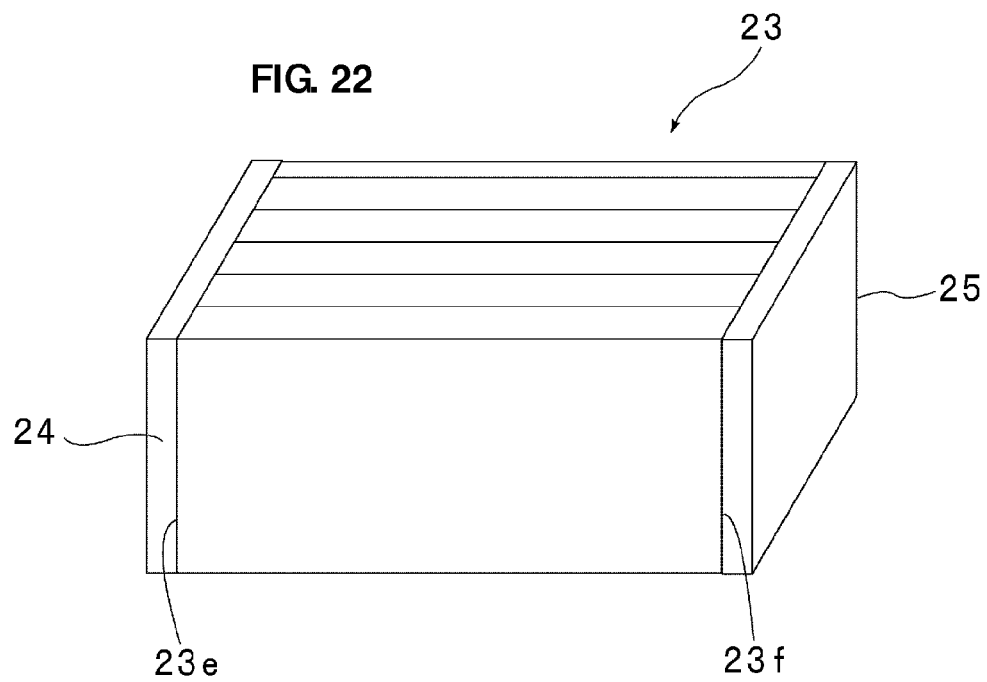
FIG. 22 is a schematic perspective view illustrating a step of forming ceramic layers on both end surfaces.

Next, as illustrated in FIG. 22, ceramic layers 24 and 25 are formed on end surfaces 23e and 23f of the ceramic member 23, respectively, so as to cover the end surfaces 23e and 23f. The ceramic layers 24 and 25 form the first and second gap portions 10C and 10D, respectively.

A method of forming the ceramic layers 24 and 25 is not particularly limited. The ceramic layers 24 and 25 can preferably be formed by, e.g., a printing method such as screen printing, an ink jet method, a coating method such as gravure coating, or an atomizing method.

Figure 23:
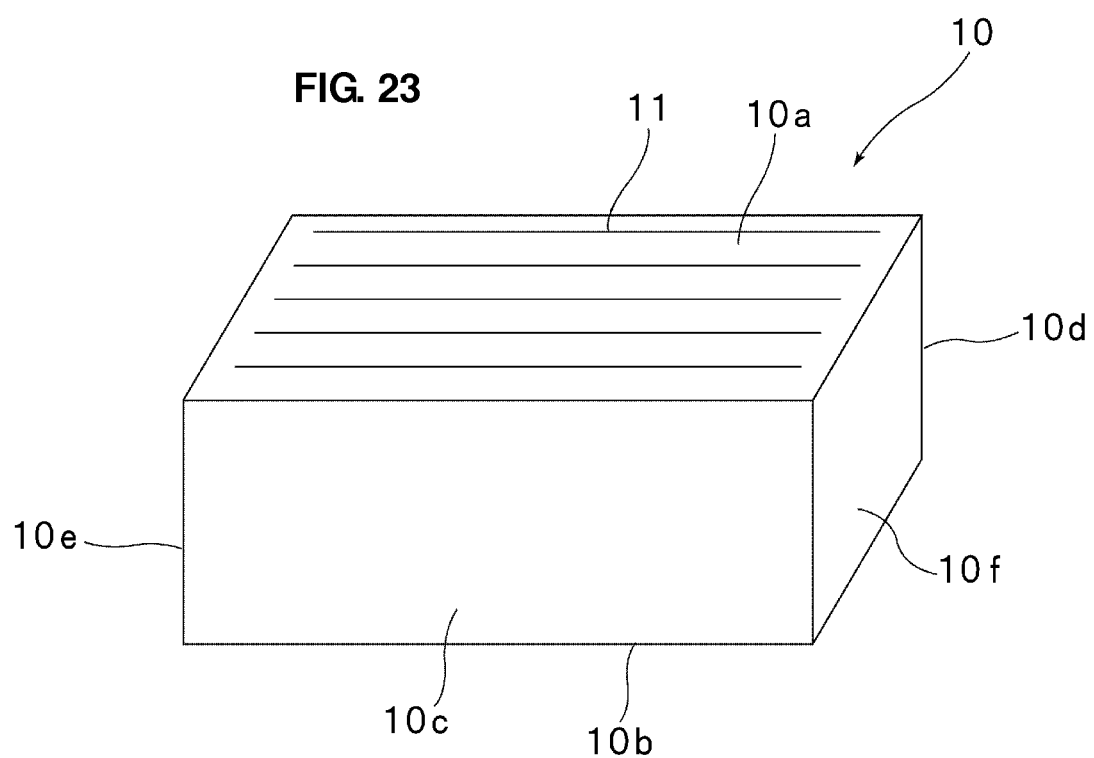
FIG. 23 is a schematic perspective view of a ceramic sintered body.

Next, the ceramic member 23 including the ceramic layers 24 and 25 formed thereon is sintered. The ceramic sintered body 10, illustrated in FIG. 23, is thereby completed.

Finally, by forming the first and second outer electrodes 13 and 14, the ceramic electronic component 1, illustrated in FIGS. 13 to 18, is completed. A method of forming the first and second outer electrodes 13 and 14 is not particularly limited. The first and second outer electrodes 13 and 14 may preferably be formed, for example, by coating a conductive paste and then baking it. In such a case, the conductive paste may be coated before firing the ceramic member 23, and the first and second outer electrodes 13 and 14 may be formed at the same time as the firing. As another example, the first and second outer electrodes 13 and 14 may preferably be formed by, e.g., plating.

A modification of the present preferred embodiment will be described below. It is to be noted that, in the following description of the modification, members having functions substantially in common with those in the present preferred embodiment are denoted by common symbols and descriptions of those members are omitted.

The present preferred embodiment has been described in connection with an example in which the first and second inner electrodes 11 and 12 are parallel or substantially parallel to the first and second lateral surfaces 10c and 10d, and the first inner electrodes 11 are led out to the first principal surface 10a, while the second inner electrodes 12 are led out to the second principal surface 10b. However, in preferred embodiments of the present invention, the arrangement of the first and second inner electrodes is not particularly limited as long as gap layers are provided in the ceramic sintered body.

For example, the first and second inner electrodes may preferably be arranged parallel or substantially parallel to the first and second principal surfaces or to the first and second end surfaces.

Further, the present preferred embodiment has been described in connection with the case in which the heterogeneous regions are arranged to extend from the one side end to the opposite side end of the ceramic sintered body in the third direction (thickness direction in the first preferred embodiment). However, in preferred embodiments of the present invention, it is only required that the heterogeneous regions are continuously arranged from one side end to an opposite side end of a region in which the first and second inner electrodes are disposed in the third direction (thickness direction in the first preferred embodiment). The heterogeneous regions may be not provided, for example, in opposite end portion (outer layer portions) of the ceramic sintered body in the third direction (thickness direction in the first preferred embodiment).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A monolithic ceramic electronic component comprising:
a parallelepiped ceramic sintered body including first and second surfaces extending in a first direction and a second direction perpendicular to the first direction, third and fourth surfaces extending in a third direction perpendicular to both the first and second directions and in the first direction, fifth and sixth surfaces extending in the second and third directions, and a plurality of ceramic layers stacked in the third direction; and a plurality of first and second inner electrodes, each including a metal, alternately arranged inside the ceramic sintered body to be opposed to each other in the third direction with at least one of the plurality of ceramic layers interposed between the adjacent first and second inner electrodes; wherein the first and second inner electrodes are each arranged to be exposed to one of the third and fourth surfaces without being exposed to the fifth and sixth surfaces; and heterogeneous regions, which include solid solutions of the metals included in the first and second inner electrodes and a metal included in the ceramic sintered body, are arranged continuously in opposite end portions of the ceramic sintered body in the first direction to extend from one side end to an opposite side end of a region in which the first and second inner electrodes are disposed in the third direction.

2. The monolithic ceramic electronic component according to claim 1, wherein the first direction is a lengthwise direction, the second direction is a widthwise direction, the third direction is a thickness direction, the first and second surfaces are first and second principal surfaces, the third and fourth surfaces are first and second lateral surfaces, and the fifth and sixth surfaces are first and second end surfaces.

3. The monolithic ceramic electronic component according to claim 1, wherein the first direction is a lengthwise direction, the second direction is a thickness direction, the third direction is a widthwise direction, the first and second surfaces are first and second lateral surfaces, the third and fourth surfaces are first and second principal surfaces, and the fifth and sixth surfaces are first and second end surfaces.

4. The monolithic ceramic electronic component according to claim 1, wherein each of the opposite end portions of the ceramic sintered body in the first direction includes a side gap portion in which the first and second inner electrodes are not disposed, and an inner layer portion other than the side gap portion; and the heterogeneous region is provided in both of the side gap portion and the inner layer portion.

5. The monolithic ceramic electronic component according to claim 1, wherein the metal dissolved in a solid state in the heterogeneous region is at least one of Ni, Mg, B, Mn, Li, Si, Ti and Ba.

6. The monolithic ceramic electronic component according to claim 1, wherein a thickness of the ceramic layer in the third direction is about 0.8 µm or less.

7. The monolithic ceramic electronic component according to claim 6, wherein, in cross-sections of the ceramic sintered body cut along planes in end portions of the first and second inner electrodes in the first direction and extending parallel or substantially parallel to the fifth and sixth surfaces, each of the heterogeneous regions occupies an area of about 88% or more of a region in which the first and second inner electrodes are opposed to each other.

8. The monolithic ceramic electronic component according to claim 1, wherein each of the opposite end portions of the ceramic sintered body in the first direction includes a side gap portion in which the first and second inner electrodes are not disposed, and an inner layer portion other than the side gap portion; and a ratio of a length of the side gap portion to a length of the ceramic sintered body in the first direction is about 30% or less.

9. The monolithic ceramic electronic component according to claim 1, wherein each of the opposite end portions of the ceramic sintered body in the first direction includes a side gap portion in which the first and second inner electrodes are not disposed, and an inner layer portion other than the side gap portion; and a length of the side gap portion in the first direction is about 30 µm or less.

* * * * *